United States Patent
Lu et al.

(10) Patent No.: US 9,131,628 B2
(45) Date of Patent: Sep. 8, 2015

(54) CIRCUIT BOARD DEVICE AND MANUFACTURING METHOD THEREOF AND POWER SUPPLY HAVING THE CIRCUIT BOARD DEVICE

(75) Inventors: Yi-Jen Lu, Taipei (TW); Shuo-Jen Shieh, Taipei (TW); Tsung-Po Hsu, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 165 days.

(21) Appl. No.: 13/490,582

(22) Filed: Jun. 7, 2012

(65) Prior Publication Data

US 2013/0021754 A1     Jan. 24, 2013

(30) Foreign Application Priority Data

Jul. 20, 2011 (CN) .......................... 2011 1 0208023

(51) Int. Cl.
H05K 7/20 (2006.01)
H05K 1/02 (2006.01)
H05K 3/28 (2006.01)

(52) U.S. Cl.
CPC .......... *H05K 7/20445* (2013.01); *H05K 1/0203* (2013.01); *H05K 3/284* (2013.01); *H05K 7/209* (2013.01); *H05K 7/20463* (2013.01); *Y10T 29/49126* (2015.01)

(58) Field of Classification Search
CPC .............................. H05K 1/0203; H05K 3/284
USPC ................. 361/704, 709, 719–721; 174/16.3, 174/520–521, 547–548
See application file for complete search history.

(56) References Cited

U.S. PATENT DOCUMENTS

| | | | | |
|---|---|---|---|---|
| 5,009,311 | A * | 4/1991 | Schenk | 206/706 |
| 5,381,304 | A * | 1/1995 | Theroux et al. | 361/706 |
| 5,485,672 | A * | 1/1996 | Carpenter et al. | 29/841 |
| 5,541,448 | A * | 7/1996 | Carpenter | 257/679 |
| 5,586,388 | A * | 12/1996 | Hirao et al. | 29/830 |
| 5,712,766 | A * | 1/1998 | Feldman | 361/737 |
| 6,317,324 | B1 * | 11/2001 | Chen et al. | 361/704 |
| 6,870,738 | B2 * | 3/2005 | Goebl | 361/719 |
| 6,967,843 | B2 * | 11/2005 | Rubenstein et al. | 361/703 |
| 7,118,646 | B2 * | 10/2006 | Hunkeler | 156/293 |
| 7,230,833 | B1 * | 6/2007 | Sickels | 361/747 |
| 7,495,916 | B2 * | 2/2009 | Shiao et al. | 361/702 |
| 7,765,687 | B2 * | 8/2010 | Pitzele et al. | 29/841 |
| 8,351,204 | B2 * | 1/2013 | Yeo et al. | 361/695 |
| 8,644,027 | B2 * | 2/2014 | Pitzele et al. | 361/752 |
| 8,885,343 | B2 * | 11/2014 | Lischeck et al. | 361/715 |
| 8,966,747 | B2 * | 3/2015 | Vinciarelli et al. | 29/832 |
| 2006/0120054 | A1 * | 6/2006 | Buschke | 361/707 |
| 2012/0287582 | A1 * | 11/2012 | Vinciarelli et al. | 361/728 |
| 2014/0355218 | A1 * | 12/2014 | Vinciarelli et al. | 361/728 |

FOREIGN PATENT DOCUMENTS

| | | | | |
|---|---|---|---|---|
| DE | 2446339 | A * | 9/1974 | H05K 5/06 |
| JP | 3215254 | B2 * | 10/2001 | H01L 25/07 |

\* cited by examiner

*Primary Examiner* — Robert J Hoffberg
(74) *Attorney, Agent, or Firm* — Rosenberg, Klein & Lee

(57) ABSTRACT

A circuit board device includes a heat dissipation housing, a circuit board, and a heat conductive adhesive. The heat dissipation housing includes a panel, and at least one end plate connected to one end of the panel and formed with a retaining groove. The circuit board is disposed in the heat dissipation housing spaced apart from the panel and has one end inserted into the retaining groove. The heat conductive adhesive is adhered to the panel and the end plate, and covers the circuit board.

12 Claims, 17 Drawing Sheets

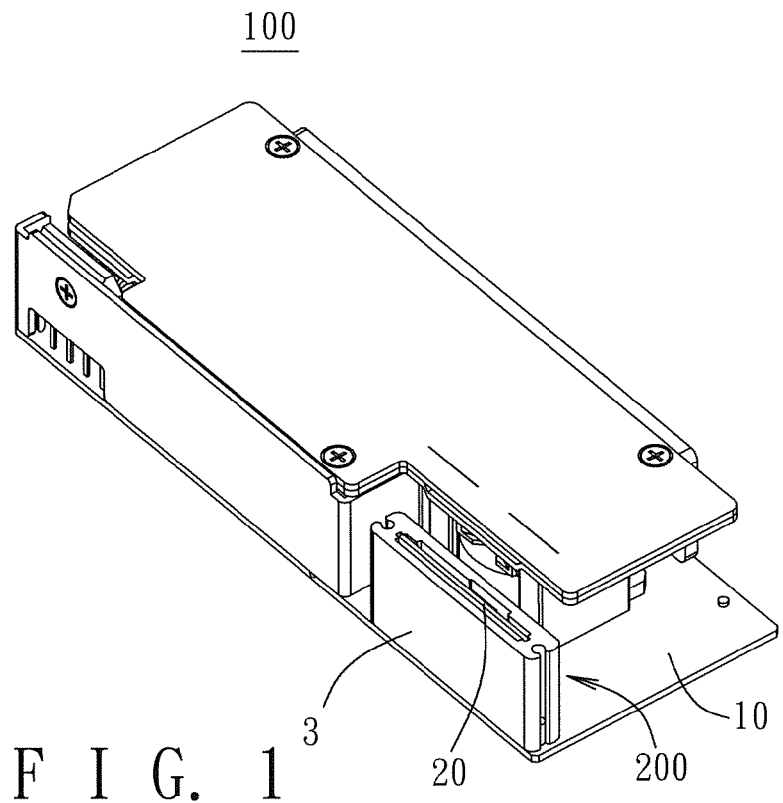
F I G. 1
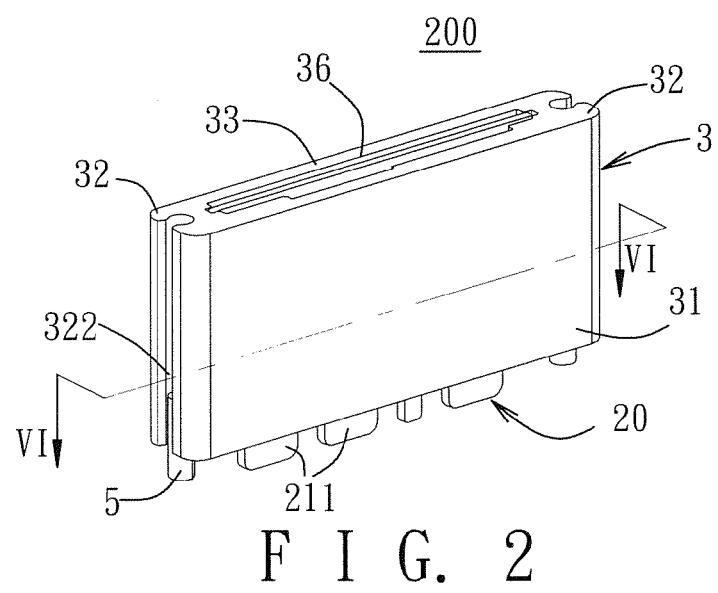
F I G. 2

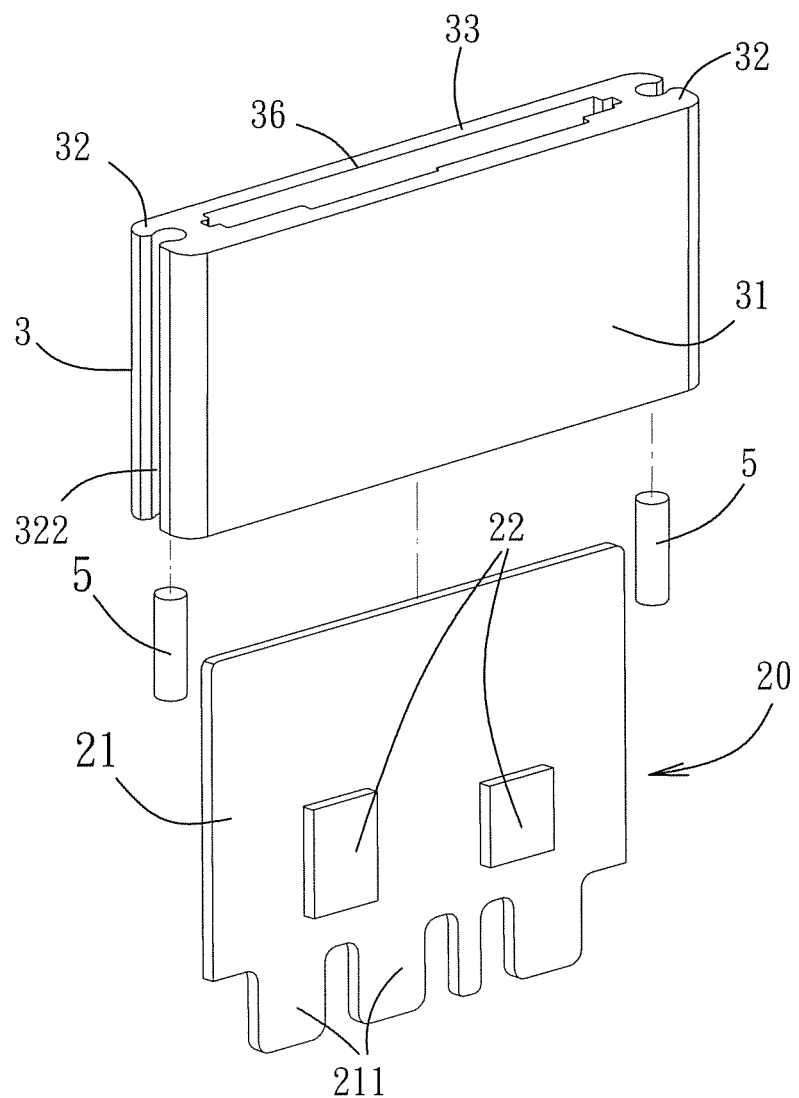
F I G. 3

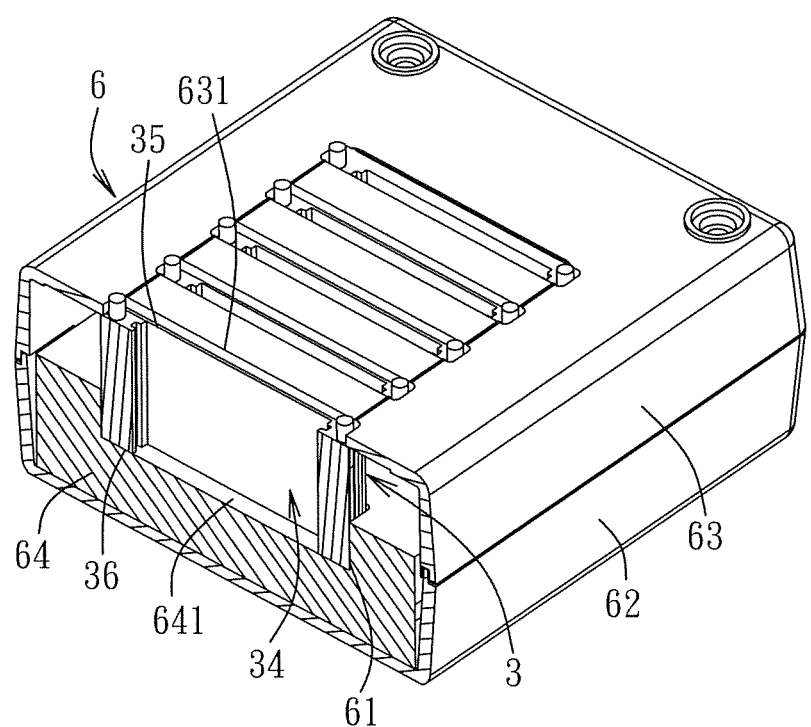
F I G. 10

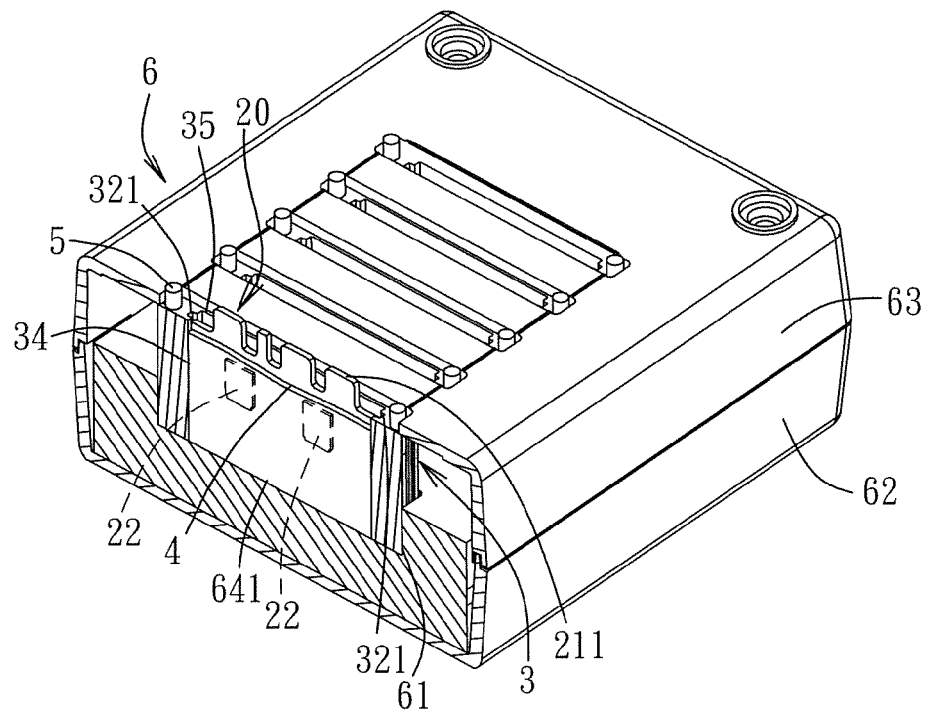
F I G. 13
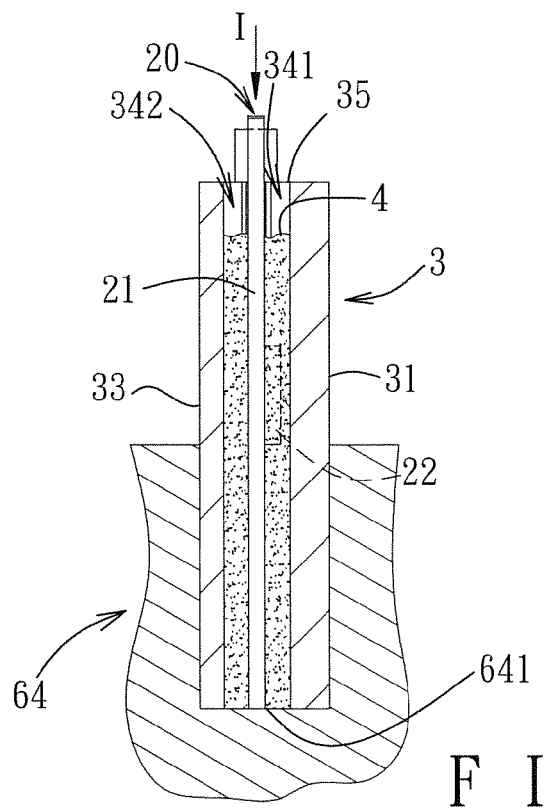
F I G. 14

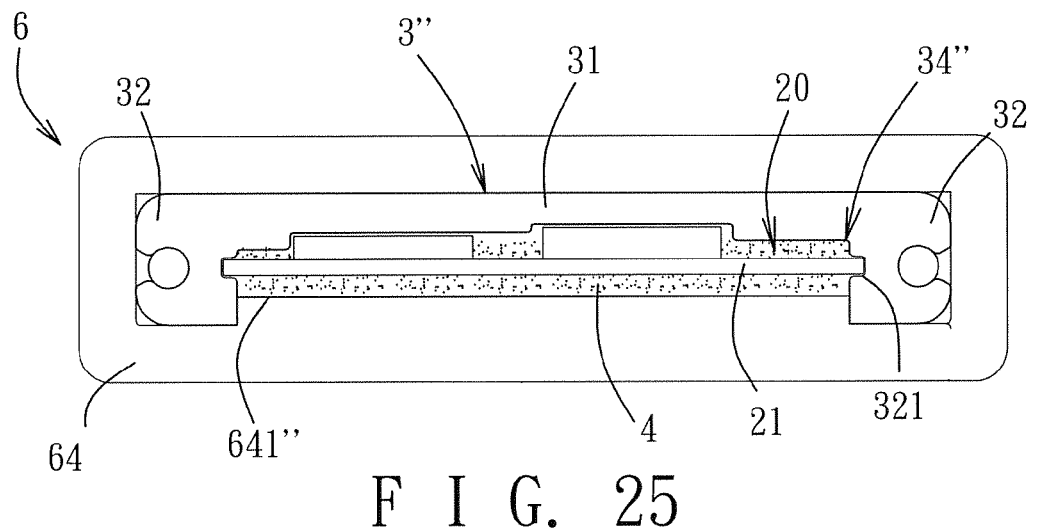
F I G. 25
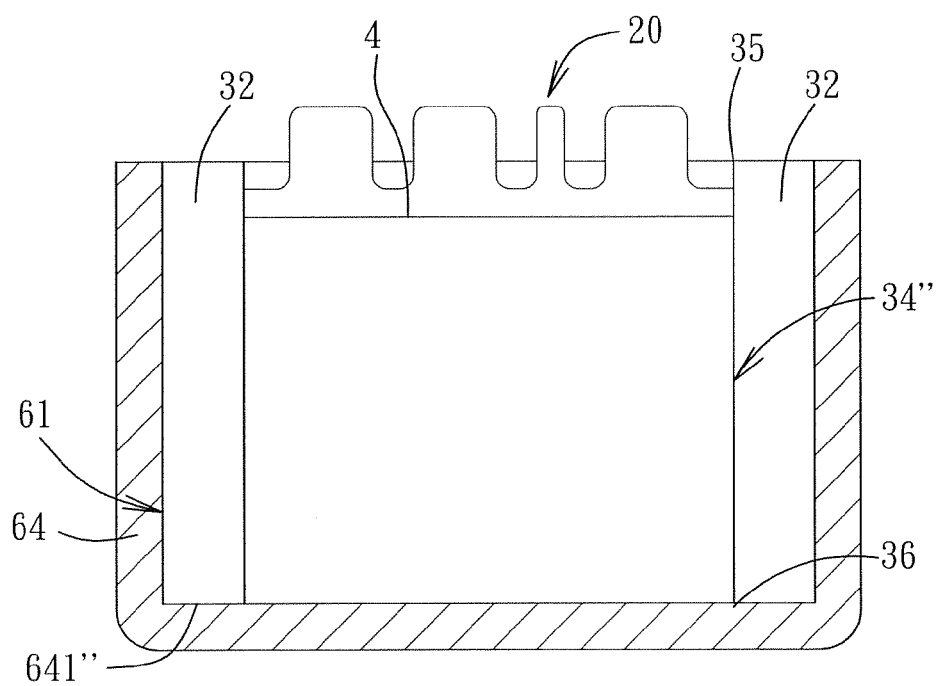
F I G. 26

CIRCUIT BOARD DEVICE AND MANUFACTURING METHOD THEREOF AND POWER SUPPLY HAVING THE CIRCUIT BOARD DEVICE

CROSS-REFERENCE TO RELATED APPLICATION

This application claims priority to Chinese Patent Application No. 201110208023.8, filed on Jul. 20, 2011.

BACKGROUND OF THE INVENTION

1. Field of the Invention

The invention relates to a circuit board device, more particularly to a circuit board device for dissipating heat from a circuit board and the manufacturing method thereof and a power supply having the circuit board device.

2. Description of the Related Art

Electronic components on a circuit board can generate heat during operation. Therefore, to quickly dissipate heat, metallic heat dissipation plates are usually provided to assist in the heat dissipation of the circuit board and electronic components thereof. Heat conductive pads are usually disposed between the electronic components and the heat dissipation plates to serve as heat conductive mediums. Bolts and nuts are cooperatively used to fix the heat dissipation plates on the circuit board so that the heat conductive pads are in tight contact with the electronic components and the heat dissipation plates. Heat generated by the electronic components can thus be conducted to and dissipate from the heat dissipation plates through the heat conductive pads.

Since the heat conductive pad is in contact with only one surface of the electronic component, heat generated by the electronic component can only be transmitted from the surface thereof to the heat conductive pad along a single direction of a heat conduction path. Hence, the uniformity and efficiency of heat dissipation are poor. Further, there is usually a plurality of electronic components on the circuit board, so that the number of heat conductive pads must correspond to that of the electronic components so as to transmit the heat from the respective electronic components. This results in increasing the number of the heat conductive pads and the cost thereof. On the other hand, the aforesaid circuit board and the heat dissipation plates are fixed together through cooperation of the bolts and nuts so that the assembly thereof is difficult and complicated, consumes considerable assembly time, and increases the cost due to use of the bolts and nuts. Moreover, it is difficult to use an automated method to produce and assemble the circuit board and the heat dissipation plates. Accordingly, the nuts may be excessively pressed by fastening forces of the bolts leading to damage of the circuit board or the heat conductive pads.

SUMMARY OF THE INVENTION

Therefore, an object of the present invention is to provide a circuit board device that includes a circuit board. Heat generated during operation of the circuit board and electronic components thereof can be transmitted to a heat conductive adhesive through multiple directions of heat conductive paths and to a heat dissipation housing through the heat conductive adhesive. This can effectively enhance uniformity and efficiency of heat dissipation.

The purpose of the present disclosure and the solution to the conventional technical problems are achieved through employment of the below technical means. According to one aspect of disclosure of this invention, a circuit board device includes a heat dissipation housing, a circuit board, and a heat conductive adhesive. The heat dissipation housing includes a first panel, and at least one end plate connected to one end of the first panel and formed with a retaining groove. The circuit board is disposed in the heat dissipation housing and has one end inserted into the retaining groove. The circuit board is spaced apart from the first panel. The heat conductive adhesive is adhered to the first panel and the end plate, and covers the circuit board.

In one embodiment, the first panel and the end plate cooperatively define a receiving space and a first opening communicating with a bottom end of the receiving space. The heat conductive adhesive is filled into the receiving space through the first opening. The circuit board is inserted into the receiving space through the first opening.

In another embodiment, the heat dissipation housing includes two end plates connected respectively to two opposite ends of the first panel. The first panel and the two end plates cooperatively define the receiving space and the first opening. Each of the end plates is formed with the retaining groove. The circuit board has two opposite ends inserted respectively into the retaining grooves of the end plates. The heat conductive adhesive is further adhered to the end plates.

In yet another embodiment, the heat dissipation housing further includes a second panel. The second panel has two opposite ends connected respectively to the end plates. The second panel is spaced apart from a side of the circuit board that is opposite to the first panel. The first and second panels and the end plates cooperatively define the receiving space and the first opening. The heat conductive adhesive is further adhered to the second panel.

In still yet another embodiment, the second panel is connected removably to the end plate, and includes two slide ribs projecting outwardly and respectively from the two opposite ends thereof. Each of the endplates is formed with a slide groove spaced apart from the retaining groove. Each of the slide ribs is connected slidably to the slide groove of a respective one of the end plates.

The circuit board includes a board body, and an electronic component disposed on one side of the board body. The first panel has an inner panel surface facing the board body, and an outer panel surface opposite to the inner panel surface. The inner panel surface includes a main surface portion spaced apart from said one side of the board body, and a stepped surface portion extending outwardly from the main surface portion toward the outer panel surface and spaced apart from the electronic component. The board body has a plurality of terminals extending out of the first opening.

The circuit board divides the receiving space into a first receiving portion and a second receiving portion. The first receiving portion is located between the circuit board and the first panel. The second receiving portion is located opposite to the first receiving portion. An area obtained by deducting a cross-sectional area of the electronic component from a cross-sectional area of the first receiving portion is equal to a cross-sectional area of the second receiving portion.

In still yet further embodiment, the first and second panels and the end plates further cooperatively define a second opening communicating with a top end of the receiving space. The circuit board device further comprises a heat sink unit which includes a heat sink, and an insert portion provided on a bottom end of the heat sink. The insert portion extends into the receiving space through the second opening to contact the circuit board. The heat conductive adhesive is further adhered to the insert portion.

Another object of this invention is to provide a power supply having a circuit board device. Heat generated during operation of the circuit board and electronic components thereof can be transmitted to a heat conductive adhesive through multiple directions of heat conductive paths and to the heat dissipation housing through the heat conductive adhesive. This can effectively enhance uniformity and efficiency of heat dissipation.

The power supply includes a main circuit board and a circuit board device.

The circuit board device includes a heat dissipation housing, a circuit board disposed in the heat dissipation housing and connected electrically to the main circuit board, and a heat conductive adhesive adhered to the heat dissipation housing and covering the circuit board.

Still another object of this invention is to provide a manufacturing method of a circuit board device. By filling heat conductive adhesive into a heat dissipation housing prior to insertion of a circuit board, the heat conductive adhesive can adhere the circuit board to the heat dissipation housing. The complexity and number of assembly steps are simplified, and the number of assembling components is reduced. As such, the assembly time can be decreased, the efficiency of production can be enhanced, and the assembly can be mass produced through an automated method.

BRIEF DESCRIPTION OF THE DRAWINGS

Other features and advantages of the present invention will become apparent in the following detailed description of the preferred embodiments with reference to the accompanying drawings, of which:

FIG. 1 is a perspective view of a circuit board device according to the first preferred embodiment of the present invention being applied to a power supply;

FIG. 2 is an enlarged perspective view of the first preferred embodiment;

FIG. 3 is an exploded perspective view of the first preferred embodiment;

FIG. 10 is a view similar to FIG. 8, but with a portion cut away for the sake of clarity;

FIG. 13 is a view similar to FIG. 11, but illustrating a circuit board being inserted into the receiving space;

FIG. 14 is an enlarged fragmentary sectional view illustrating how the circuit board is inserted into the receiving space through the first opening in the heat dissipation housing;

FIG. 25 is a schematic top view, illustrating the circuit board device disposed in an auxiliary mold;

FIG. 26 is an enlarged sectional view of the circuit board device and the auxiliary mold in the fourth preferred embodiment;

DETAILED DESCRIPTION OF THE PREFERRED EMBODIMENTS

Figure 4:
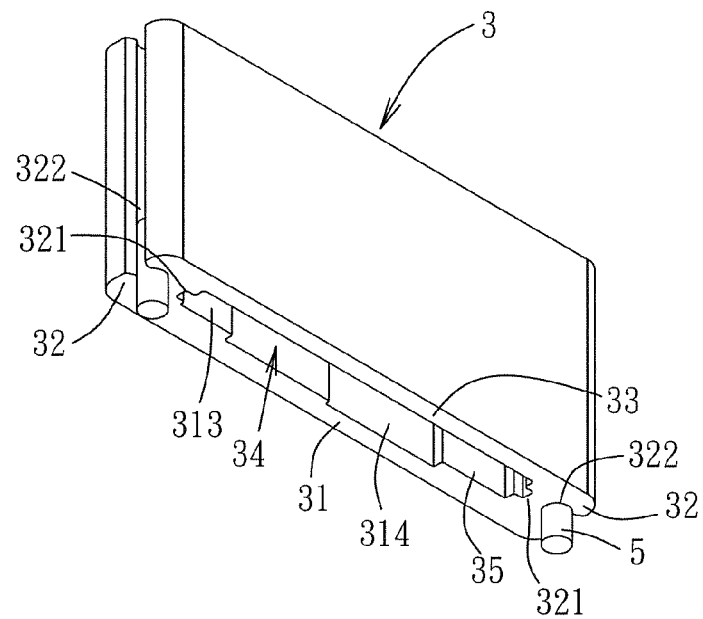
FIG. 4 is an assembled perspective view of a heat dissipation housing and solder pins of the first preferred embodiment.

The above-mentioned and other technical contents, features, and effects of this disclosure will be clearly presented from the following detailed description of the five embodiments in coordination with the reference drawings. Through description of the concrete implementation method, the technical means employed and the effectiveness to achieve the predetermined purposes of the present disclosure will be thoroughly and concretely understood. However, the enclosed drawings are used for reference and description only, and are not used for limiting the present disclosure.

Before this disclosure is described in detail, it should be noted that, in the following description, similar elements are designated by the same reference numerals.

Referring to FIGS. 1, 2 and 3, a circuit board device 200 according to the first preferred embodiment of the present invention is applied to a power supply 100. The power supply 100 includes a main circuit board 10. In this embodiment, the main circuit board 10 includes a primary side circuit and a portion of a secondary side circuit.

As shown in FIGS. 1 to 5, the circuit board device 200 is disposed on the main circuit board 10 and includes a circuit board 20, a heat dissipation housing 3 and a heat conductive adhesive 4. The circuit board 20 is inserted into and electrically connected to the main circuit board 10. However, in actual applications, it is not limited as such. The heat dissipation housing 3 and the heat conductive adhesive 4 form a heat dissipation module. The circuit board 20 includes aboard body 21, and at least one electronic component 22 disposed on one side of the board body 21. Two electronic components 22 are exemplified in this embodiment. The heat dissipation housing 3 is made of metal having good heat conductivity. In this embodiment, the heat dissipation housing 3 is made of aluminum. The heat dissipation housing 3 is hollow, and includes a first panel 31 and two end plates 32 respectively connected to two opposite ends of the first panel 31. Each of the end plates 32 is formed with a vertically extending retaining groove 321 that extends inwardly from an inner face thereof. The board body 21 has two opposite ends inserted respectively into the retaining grooves 321 of the end plates 32, so that the board body 21 and the electronic components 22 are spaced apart from the first panel 31. The heat dissipation housing 3 further includes a second panel 33 opposite to the first panel 31 and having two opposite ends connected respectively to the end plates 32. The second panel 33 is spaced apart from a side of the board body 21 that is opposite to the first panel 31. Because the two opposite ends of the board body 21 are inserted respectively into the retaining grooves 321 of the end plates 32, the board body 21 can be simultaneously spaced apart from the first and second panels 31, 33. The heat conductive adhesive 4 is filled between the circuit board 20 and the first panel 31, between the circuit board 20 and the second panel 33, and between each retaining groove 321 of the end plate 32 and the board body 21 so as to cover the board body 21 and the electronic components 22 and adhere to the first panel 31, the second panel 33 and the end plates 32. Through this configuration, heat generated during operation of the electronic components 22 and the board body 21 can be transmitted to the heat dissipation housing 3 through the heat conductive adhesive 4, and is dissipated through heat exchange between the heat dissipation housing 3 and the external air.

It should be noted that the endplates 32 can be formed integrally as one piece with or can be connected removably to the first panel 31, and the second panel 33 can be formed integrally as one piece with or can be connected removably to the end plates 32. In this embodiment, because the heat dissipation housing 3 is formed by aluminum extrusion, the end plates 32 are formed integrally as one piece with the first panel 31, and the second panel 33 is formed integrally as one piece with the end plates 32.

The first panel 31, the second panel 33 and the end plates 32 of the heat dissipation housing 3 cooperatively define a receiving space 34 and a first opening 35 communicating with a bottom end of the receiving space 34. Each of the retaining grooves 321 communicates with the receiving space 34. In this embodiment, the first panel 31, the second panel 33 and the endplates 32 also cooperatively define a second opening 36 communicating with a top end of the receiving space 34. This will be described in detail later. The first opening 35 communicates the receiving space 34 and each retaining groove 321 with the outside. Through this, the board body 21 of the circuit board 20 can be inserted into the retaining grooves 321 through the first opening 35 and can slide along an extending direction of the retaining grooves 321 into the receiving space 34. On the other hand, the heat conductive adhesive 4 in liquid state can also be filled into the receiving space 34 through the first opening 35. Because the first opening 35 can simultaneously allow insertion of the circuit board 20 and filling of the liquid state heat conductive adhesive 4 into the heat dissipation housing 3 at the same side thereof, it can improve the ease of assembly during the manufacturing process. In the manufacturing process of this embodiment, the filling of the heat conductive adhesive 4 is first performed before the insertion of the circuit board 20, which will be described in detail later.

Further, the board body 21 of the circuit board 20 has a plurality of terminals 211 extending through the first opening 35 so as to be exposed from a bottom end of the heat dissipation housing 3. Each of the terminals 211 is inserted into slots (not shown) in the main circuit board 10 (see FIG. 1) so that the circuit board 20 is electrically coupled to the main circuit board 10. It should be noted that, in an alternative embodiment, the terminals 211 may not extend through the first opening 35. In this case, the amount of the heat conductive adhesive 4 is controlled so as not to affect insertion of the terminals 211. Further, a slotted seat (not shown) that protrudes from the main circuit board 10 can be inserted into the receiving space 34 to receive the terminals 211. Similarly, the circuit board 20 can be electrically coupled to the main circuit board 10. To firmly fix the heat dissipation housing 3 to the main circuit board 10, in this embodiment, each end plate 32 is further formed with a channel groove 322 at a side opposite to the retaining groove 321, and the circuit board device 200 further includes two solder pins 5 each insertedly fitted into the channel groove 322 of the respective end plate 32 and having a portion extending out of a bottom end of the channel groove 322. By soldering the soldering pins 5 to the main circuit board 10, the heat dissipation housing 3 can be positioned firmly on the main circuit board 10, and the terminals 211 of the circuit board 20 can be firmly inserted into the slots in the main circuit board 10.

The first panel 31 of the heat dissipation housing 3 includes an inner panel surface 311 facing the circuit board 20, and an outer panel surface 312 opposite to the inner panel surface 311. The inner panel surface 311 includes a main surface portion 313 spaced apart from the board body 21, and a stepped surface portion 314 extending outwardly from the main surface portion 313 toward the outer panel surface 312 and spaced apart from the electronic components 22. In this embodiment, since two electronic components 22 having different thicknesses are exemplified, a deep section and a shallow section have the stepped surface portion 314 designed to correspond to the electronic components 22. The stepped surface portion 314 is designed such that it can correspond to the number and thickness or shape of the electronic components 22.

In this embodiment, each of the distance between the main surface portion 313 of the inner panel surface 311 and the board body 21, between the stepped surface portion 314 and the electronic components 22, and between an inner panel surface of the second panel 33 and the board body 21 is preferably short (for example, a distance that can achieve insulation is acceptable). Apart from decreasing the use amount of the heat conductive adhesive 4, heat generated during operation of the board body 21 and the electronic components 22 can be quickly transmitted to the first and second panels 31, 33 through the heat conductive adhesive 4. Further, in other alternatives, the distance between the main surface portion 313 of the inner panel surface 311 and the board body 21 may be the same as that between the stepped surface portion 314 and the electronic components 22 so that the space needed to fill the heat conductive adhesive 4 can be reduced, thereby minimizing the use amount and the cost of the heat conductive adhesive 4.

Figure 5:
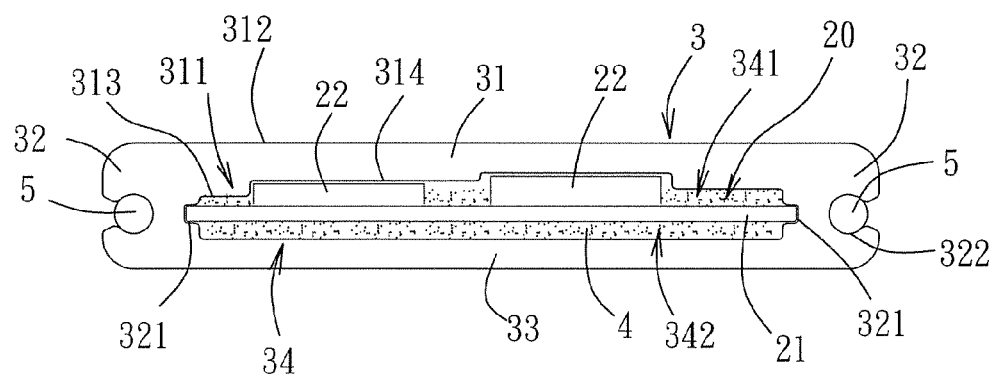
FIG. 5 is a schematic top view of the first preferred embodiment.
Figure 6:
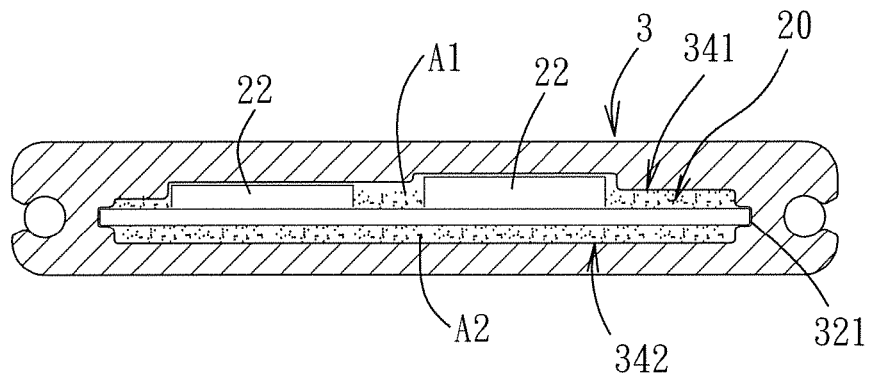
FIG. 6 is a sectional view of the first preferred embodiment taken along line VI-VI of FIG. 2.

With reference to FIGS. 2, 5 and 6, FIG. 6 is a sectional view of the circuit board device 200 taken along the line VI-VI of FIG. 2. The circuit board 20 divides the receiving space 34 into a first receiving portion 341 and a second receiving portion 342. The second receiving portion 342 is located opposite to the first receiving portion 341. The first receiving portion 341 is located between the circuit board 20 and the first panel 31. The second receiving portion 342 is located on one side of the circuit board 20 that is opposite to the first panel 31. In this embodiment, the second receiving portion 342 is located between the circuit board 20 and the second panel 33. Preferably, as shown in FIG. 6, an area (A1) obtained by deducting a cross-sectional area of each electronic component 22 from a cross-sectional area of the first receiving portion 341 is equal to a cross-sectional area (A2) of the second receiving portion 342. The term "equal" as used here means exactly the same or very close to.

Since in the manufacture of the circuit board device 200, the heat conductive adhesive 4 in liquid state (see FIG. 11) is first filled into the receiving space 34, before the circuit board 20 is inserted into the receiving space 34, as the circuit board 20 moves into the receiving space 34 along the extending direction of the retaining grooves 321, it will squeeze through the liquid state heat conductive adhesive 4. The liquid state heat conductive adhesive 4, in turn, will flow into a space between the circuit board 20 and the heat dissipation housing 3 (i.e., the first and second receiving portions 341, 342). Considering that the liquid state heat conductive adhesive 4 is squeezed by the circuit board 20 to flow into the first and second receiving portions 341, 342, the resistive force received by the heat conductive adhesive 4 in each of the first and second receiving portions 341, 342 may be different so that the amount of heat conductive adhesive 4 flowing into each of the first and second receiving portions 341, 342 may not be uniform. Therefore, by deducting a cross-sectional area of each electronic component 22 from a cross-sectional area of the first receiving portion 341 (the sectioning of the first receiving portion 341 must include that of the electronic components 22, as shown in line VI-VI of FIG. 2), the area (A1) that is the smallest cross-sectional area the heat conductive adhesive 4 in liquid state may flow through the receiving portion 341 is equal to the cross-sectional area (A2) of the second receiving portion 342. That is, the obtained area (A1) is exactly the same or very close to the area (A2), so that the resistive force received by the liquid state heat conductive adhesive 4 when pressed by the circuit board 20 to flow into each of the first and second receiving portions 341, 342 are substantially equal. Hence, the amount of the heat conductive adhesive 4 flowing into the first and second receiving portion 341, 342 are substantially uniform. The heights of the liquid state heat conductive adhesive 4 in the first and second receiving portions 341, 342 are the same after the circuit board 20 is positioned in the receiving space 34, so that the heat conductive adhesive 4 completely covers the board body 21 of the circuit board 20. Through this configuration, a difference in the amount of the liquid state heat conductive adhesive 4 flowing into the first and second receiving portions 341, 342, which may lead to different heights of the heat conductive adhesive 4 in the first and second receiving portions 341, 342 and which may result in the heat conductive adhesive 4 not completely covering the board body 21 of the circuit board 20, can be prevented.

Below is the detailed description of a manufacturing method of the circuit board device 200.

Figure 7:
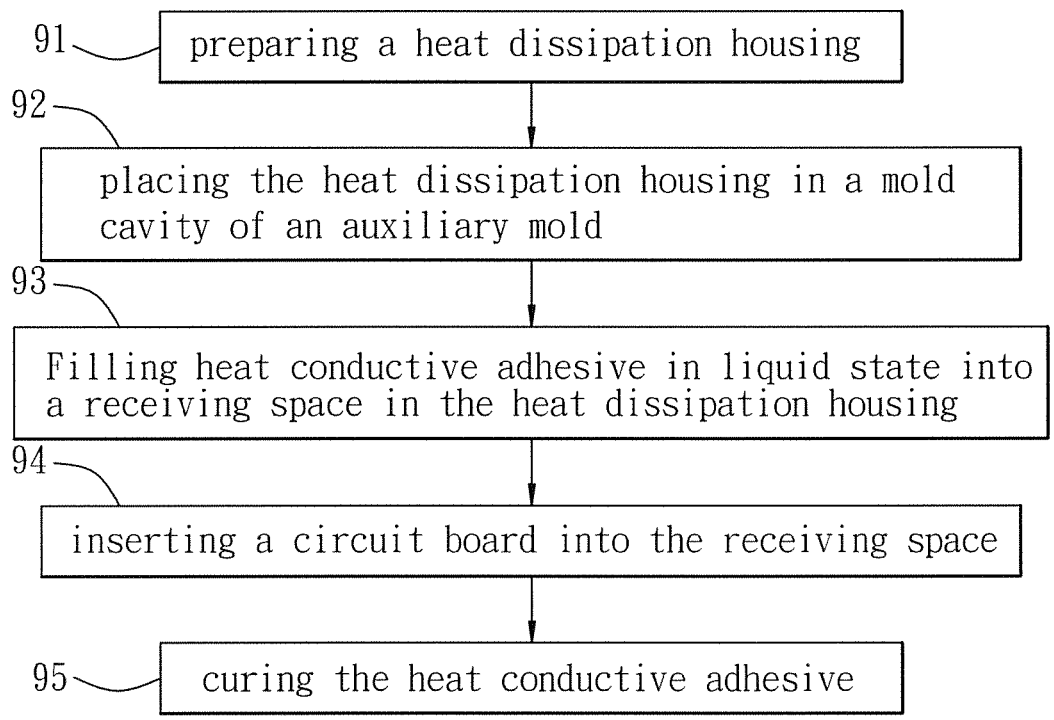
FIG. 7 is a flow chart, illustrating the steps involved in a manufacturing method according to the first preferred embodiment of the circuit board device.
Figure 8:
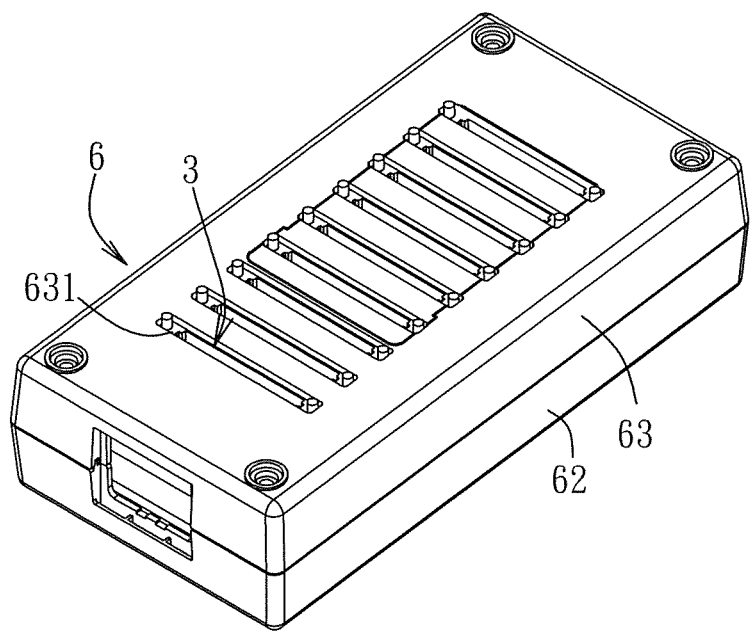
FIG. 8 is a perspective view, illustrating the heat dissipation housing disposed in an auxiliary mold.
Figure 9:
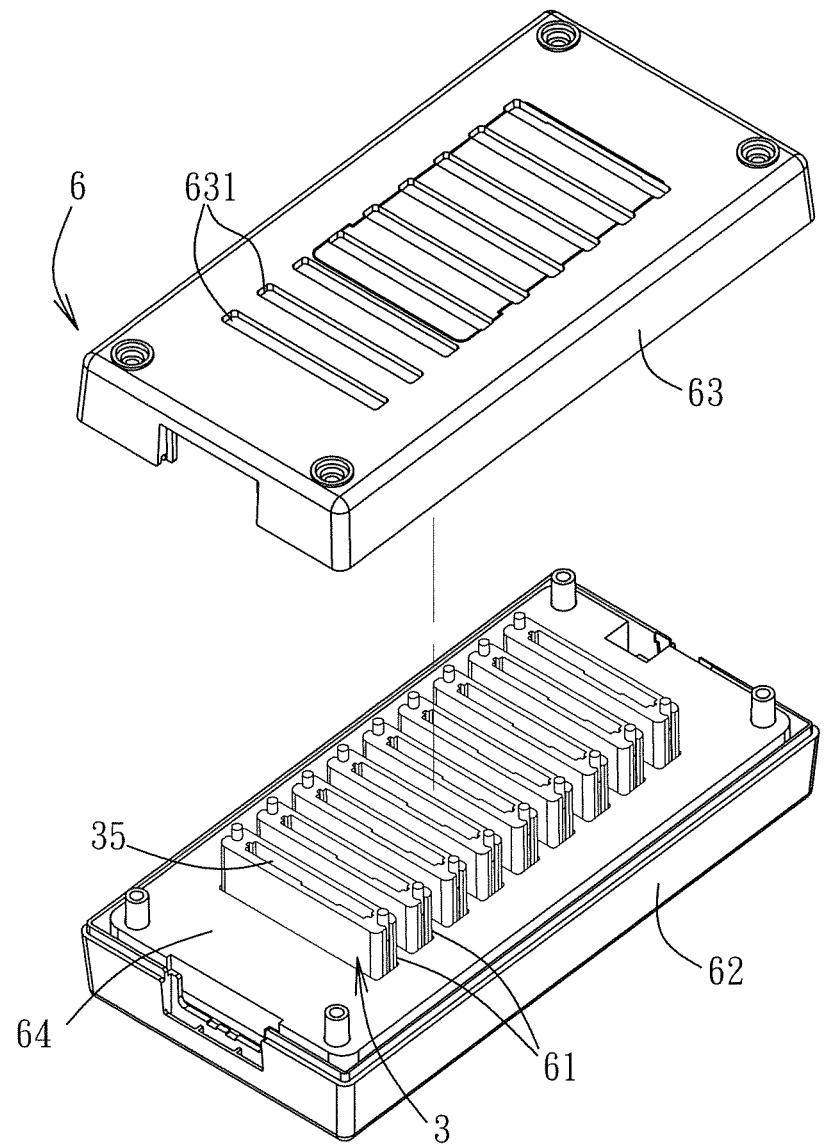
FIG. 9 is a view similar to FIG. 8, but with an upper housing of the auxiliary mold being removed for the sake of clarity.

FIG. 7 is a flow chart, illustrating the steps involved in the manufacturing method of the circuit board device 200. The method includes steps 91 to 95.

In step 91, with reference to FIGS. 3 to 5, the heat dissipation housing 3 is prepared.

In this embodiment, the heat dissipation housing 3 is made by aluminum extrusion. Through the aluminum extrusion, a long rod-like semi-finished product (not shown) is produced. The semi-finished product is then cut into a plurality of end products. Each end product is the heat dissipation housing 3. At this time, the heat dissipation housing 3 is formed with the first panel 31, the endplates 32, the second panel 33, the receiving space 34, the first opening 35, the second opening 36 (as shown in FIG. 3), and the inner panel surface 311 of the first panel 31. Through this method, the semi-finished product can be cut according to the required length of the heat dissipation housing 3, thereby enhancing flexibility of the manufacturing method. Moreover, this method also enhances the manufacturing efficiency to a large extent.

In step 92, with reference to FIGS. 7 to 10, the heat dissipation housing 3 is placed in a mold cavity 61 of an auxiliary mold 6 such that the first opening 35 in the heat dissipation housing 3 is positioned upward.

In the embodiment, the auxiliary mold 6 includes a lower housing 62, an upper housing 63 covering the lower housing 62, and a mold seat 64 disposed in the lower housing 62. The mold seat 64 is formed with a plurality of spaced-apart mold cavities 61. The upper housing 63 is formed with a plurality of openings 631 corresponding in position to the mold cavities 61. During assembly, the heat dissipation housing 3 is first inserted to the mold cavity 61 of the mold seat 64 such that the first opening 35 in the heat dissipation housing 3 is positioned upward. The upper housing 63 is then connected to the lower housing 62 to cover the same. At this time, the opening 631 in the upper housing 63 is aligned with the first opening 35 in the heat dissipation housing 3 and the upper housing 63 abuts against an end of the heat dissipation housing 3 that forms the first opening 35. The heat dissipation housing 3 can thus be fixed stably in and prevented from disengaging from the mold cavity 61. It should be noted that in actual use, a plurality of the heat dissipation housings 3 can be inserted respectively into a plurality of mold cavities 61 of the mold seat 64, after which the upper housing 63 is connected to the lower housing 62 to position the heat dissipation housings 3 in the mold seat 64. The design of the auxiliary mold 6 is not limited to the disclosed embodiment. In an alternative embodiment, a plurality of the heat dissipation housings 3 are in close contact with each other and are disposed in an elongated mold cavity 61 of the mold seat 64, after which the heat dissipation housings 3 are clamped together by a clamping device and fixed to the mold seat 64. A positioning effect can be similarly achieved.

A forming face 641 of the mold cavity 61 of the mold seat 64 cooperates with the heat dissipation housing 3. In this embodiment, the forming face 641, as shown in FIG. 10, is a bottom surface located at a bottom end of the mold cavity 61. With the forming face 641 closing the second opening 36 in the heat dissipation housing 3, the receiving space 34 in the heat dissipation housing 3 can communicate with the outside only through the first opening 35.

Figure 11:
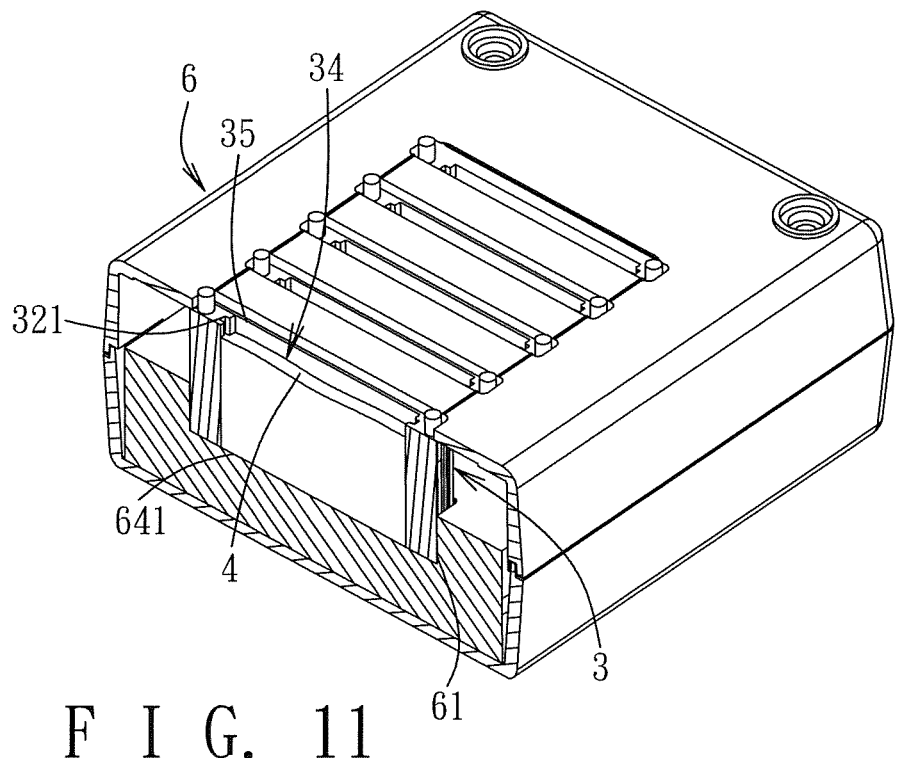
FIG. 11 is a view similar to FIG. 10, but illustrating a heat conductive adhesive being filled into a receiving space in the heat dissipation housing.
Figure 12:
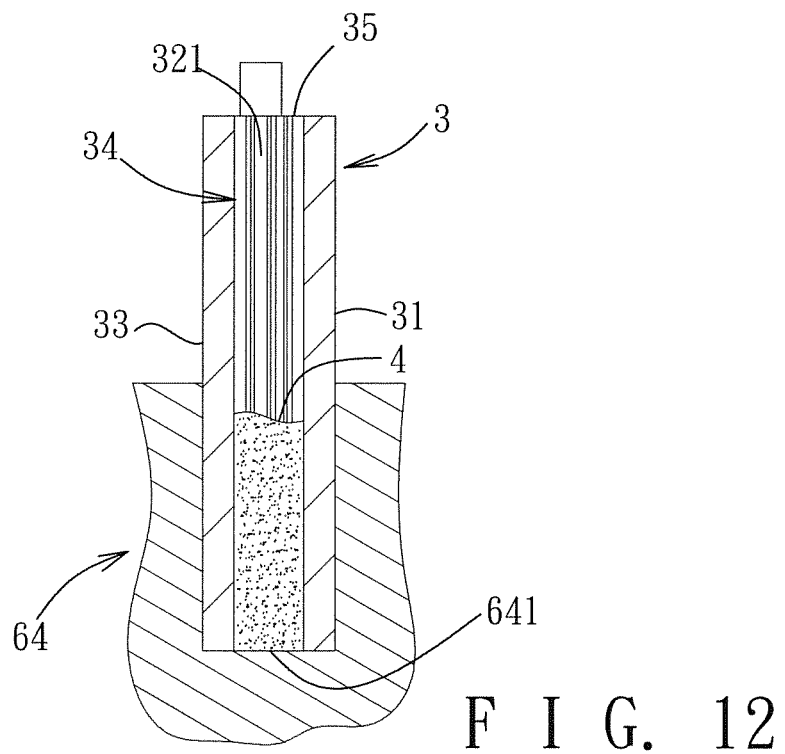
FIG. 12 is an enlarged fragmentary view, illustrating how the heat conductive adhesive is filled into the receiving space through a first opening in the heat dissipation housing.

In step 93, with reference to FIGS. 7, 11 and 12, the heat conductive adhesive 4 in liquid state is filled into the receiving space 34 in the heat dissipation housing 3.

In this embodiment, prior to step 93, the total volume of the first receiving portion 341 (see FIG. 5) and the second receiving portion 342 (see FIG. 5) is first calculated to determine the amount of the liquid state heat conductive adhesive 4 needed for filling. Preferably, the amount of the liquid state heat conductive adhesive 4 is not greater than the total volume to prevent overflow of the heat conductive adhesive 4 through the first opening 35 when the circuit board 20 is inserted into the receiving space 34. Afterwards, as stated in step 93, the liquid state heat conductive adhesive 4 is filled into the receiving space 34 through the first opening 35. In this embodiment, the heat conductive adhesive 4 is made of a curable and heat conductive material, such as AB adhesive or room temperature vulcanized (RTV) adhesive. It should be noted that the forming face 641 is made of a material that can prevent the heat conductive adhesive 4 to disengage easily therefrom when the heat conductive adhesive 4 is cured. As such, the circuit board device 200 can be easily retrieved from the mold cavity 61 after completion of the manufacture.

In step 94, with reference to FIGS. 7, 13 and 14, the circuit board 20 is inserted into the receiving space 34 so as to be covered by the heat conductive adhesive 4.

In this embodiment, the terminals 211 of the circuit board 20 must be positioned upward first before the circuit board 20 is inserted into the receiving space 34. As such, the terminals 211 are prevented from being stained with the heat conductive adhesive 4 during insertion of the circuit board 20.

Two opposite ends of the board body 21 of the circuit board 20 are brought to align with the respective retaining grooves 321 of the heat dissipation housing 3, after which the circuit board 20 is inserted into the receiving space 34 via the first opening 35 along the direction of an arrow (I) shown in FIG. 14. With the two ends of the board body 21 being guided by the respective retaining grooves 321, the circuit board 20 can be inserted straight into the receiving space 34. This can ensure that the circuit board 20 is spaced apart from the first and second panels 31, 33 of the heat dissipation housing 3 and will not move slantingly to permit contact between the electronic components 22 and the first panel 31. Contact between the electronic components 22 and the first panel 31 will result in short circuit when the circuit board 20 is working. It should be noted that the width of each retaining grooves 321 is preferred to be slightly greater than the thickness of the board body 21 of the circuit board 20 so that the board body 21 can slide smoothly along the extending direction of the retaining groove 321.

With reference to FIGS. 6, 13 and 14, as the circuit board 20 is inserted into the receiving space 34 and moves along the extending direction of the retaining grooves 321, it squeezes the liquid state heat conductive adhesive 4 inside the receiving space 34 and the retaining grooves 321, so that the heat conductive adhesive 4 is moved into the first and second receiving portions 341, 342 and spaces between the board body 21 and the retaining grooves 321. As described in the aforementioned, since the obtained area (A1) is equal to the cross-sectional area (A2), the resistive forces received by the liquid state heat conductive adhesive 4 in the first and second receiving portions 341, 342 are substantially equal. As such, the amount of the liquid state heat conductive adhesive 4 flowing into the first and second receiving portions 341, 342 are also substantially equal. When the board body 21 abuts against the forming face 641 of the mold seat 64, the circuit board 20 is fixed, and cannot move further. At this time, the height of the liquid state heat conductive adhesive 4 in the first and second receiving portions 341, 342 are the same so that the heat conductive adhesive 4 can completely cover the portion of the circuit board 20 that is located in the receiving space 34, as shown in FIG. 14.

It is worth noting that the first opening 35 becomes narrow after the insertion of the circuit board 20 into the receiving space 34 and that the liquid state heat conductive adhesive 4 has a high viscosity coefficient. Hence, during production, if the circuit board 20 is first inserted into the receiving space 34, the filling of the heat conductive adhesive 4 into the first and second receiving portions 341, 342 is substantially difficult even to the point of not being able to enter the receiving space 34. Therefore, the steps of the manufacturing method of the circuit board device 200 of this embodiment starts with the filling of the liquid state heat conductive adhesive 4 in step 93 and is followed by the insertion of the circuit board 20 in step 94. This substantially decreases the difficulty and the time to produce the circuit board device 200, thereby enhancing the manufacturing efficiency. Additionally, the insertion of each solder pin 5 into the respective channel groove 322 can be performed in any of the steps between steps 92 to 94.

In step 95, the heat conductive adhesive 4 is cured so as to adhere fixedly to the heat dissipation housing 3 and the circuit board 20.

With the liquid state heat conductive adhesive 4 (e.g., AB epoxy adhesive) being able to cure by itself under room temperature to solid state heat conductive adhesive (see FIG. 5), the heat conductive adhesive 4 can adhere fixedly to the circuit board 20 and the heat dissipation housing 3. The upper housing 63 is then removed from the lower housing 62, and the heat dissipation housing 3 is retrieved from the mold cavity 61 of the auxiliary mold 6. Hence, the production of the circuit board device 200 is completed. Preferably, to shorten the curing time of the heat conductive adhesive 4, in step 95, the liquid state heat conductive adhesive 4 is heated. Through this, the processing time can be effectively reduced. It should be noted that following use of different types of the heat conductive adhesive 4, the method to accelerate curing is also different. For example, other types of heat conductive adhesives can be quickly cured either by cooling or increasing its humidity.

Figure 15:
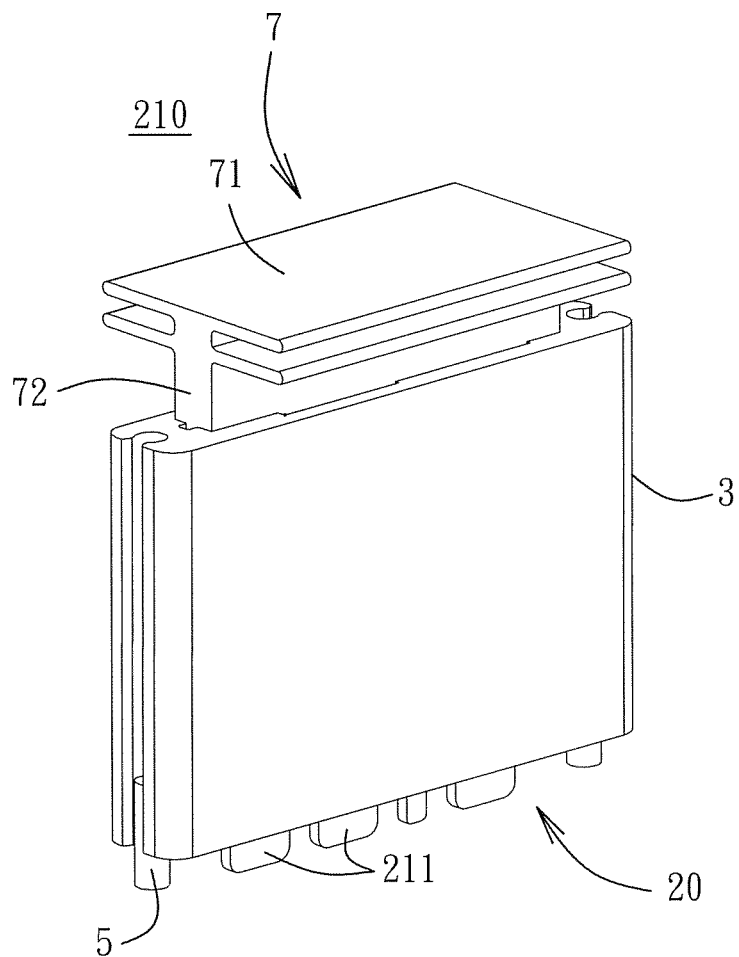
FIG. 15 is a perspective view of a circuit board device according to the second preferred embodiment of the present invention.
Figure 16:
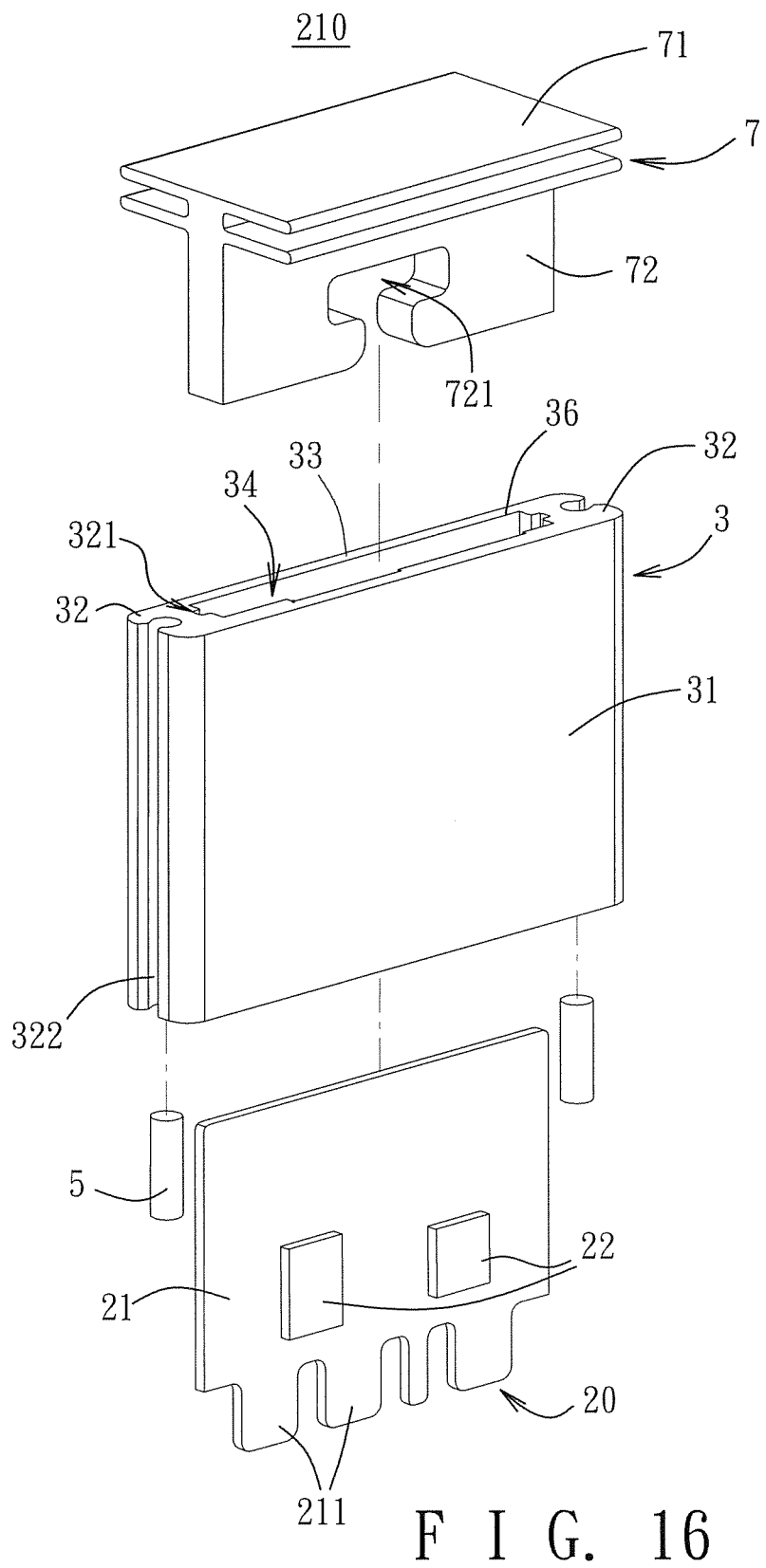
FIG. 16 is an exposed perspective view of the second preferred embodiment.

FIGS. 15 and 16 illustrate a circuit board device 210 according to the second preferred embodiment of the present invention. The whole structure and the manufacturing method of the circuit board device 210 are substantially similar to that described in the first preferred embodiment. However, in this embodiment, the circuit board device 210 further comprises a heat sink unit 7. The heat sink unit 7 includes a heat sink 71, and an insert portion 72 projecting from a bottom end of the heat sink 71. The insert portion 72 is inserted into the receiving space 34 through the second opening 36 in the heat dissipation housing 3 to contact the board body 21. The cured solid state heat conductive adhesive 4 is adhered between the insert portion 72 and the heat dissipation housing 3 so that the heat sink unit 7 can be stably positioned on the heat dissipation housing 3. Through the disposition of the heat sink unit 7, the heat dissipation efficiency of the circuit board device 210 can be further enhanced.

Figure 17:
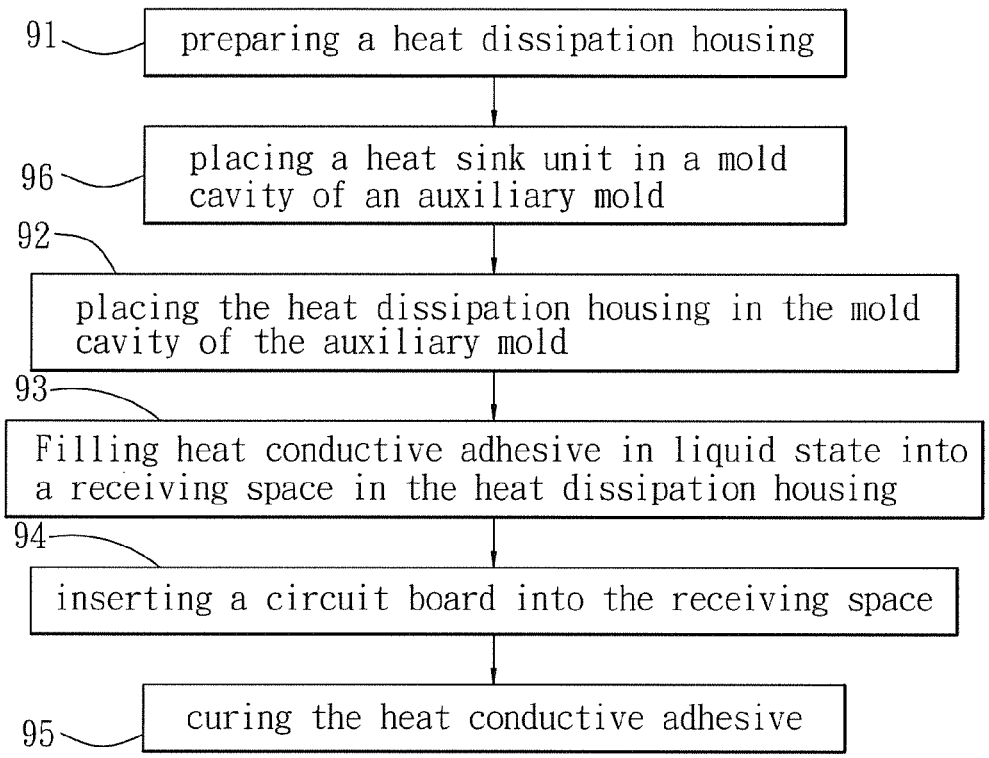
FIG. 17 is a flow chart, illustrating the steps involved in a manufacturing method of the circuit board device according to the second preferred embodiment.
Figure 18:
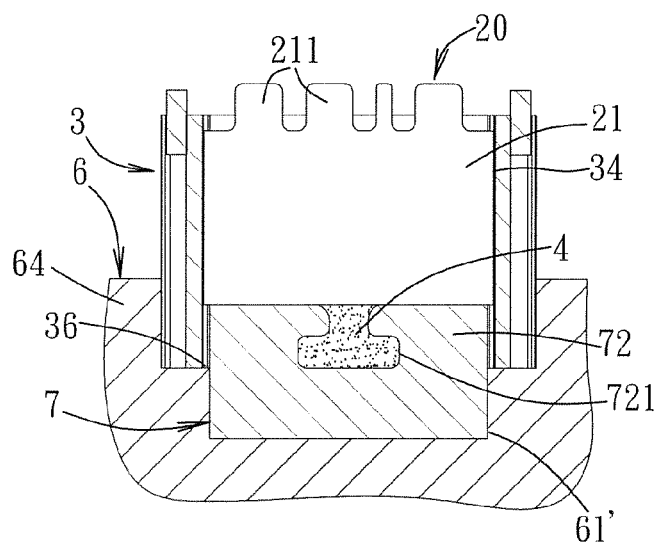
FIG. 18 is an enlarged fragmentary sectional view, illustrating the circuit board device of the second preferred embodiment disposed in an auxiliary mold.

As shown in FIGS. 16, 17 and 18, the manufacturing method of the circuit board device 210 further includes step 96 after step 91 and before step 92. In step 96, the heat sink unit 7 is placed in the mold cavity 61' of the mold seat 64 of the auxiliary mold 6 such that the insert portion 72 of the heat sink unit 7 is positioned upward. In this embodiment, the mold cavity 61' has a stepped structure. In step 92, the heat dissipation housing 3 is placed in the mold cavity 61' such that the first opening 35 is positioned upward and such that the insert portion 72 of the heat sink unit 7 can extend into the receiving space 34 through the second opening 36. In step 93, the heat conductive adhesive 4 in liquid state, aside from covering the circuit board 20, also covers the insert portion 72 of the heat sink unit 7. Because the insert portion 72 is formed with an engaging groove 721, the heat conductive adhesive 4 will also fill up the engaging groove 721 of the insert portion 72. Finally, after step 95, the heat conductive adhesive 4 is adhered to the heat dissipation housing 3, the circuit board 20 and the insert portion 72 of the heat sink unit 7 after it is cured, and the circuit board device 210 can then be retrieved from the mold cavity 61'.

Figure 19:
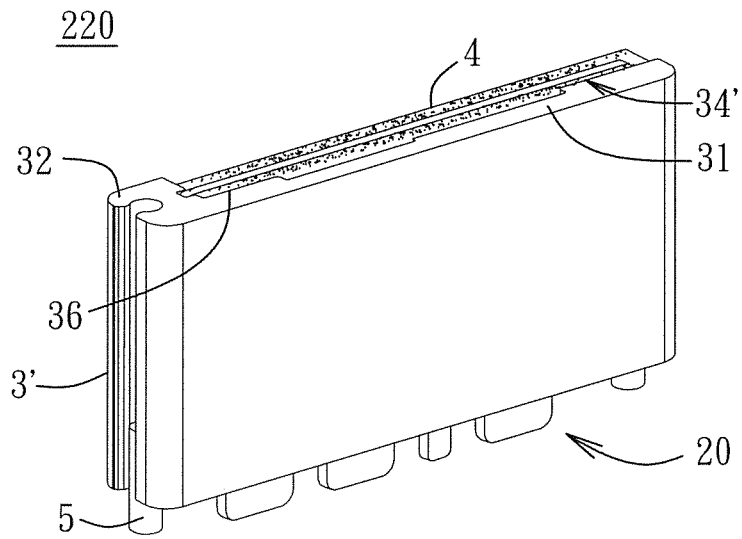
FIG. 19 is a perspective view of a circuit board device according to the third preferred embodiment of the present invention.
Figure 20:
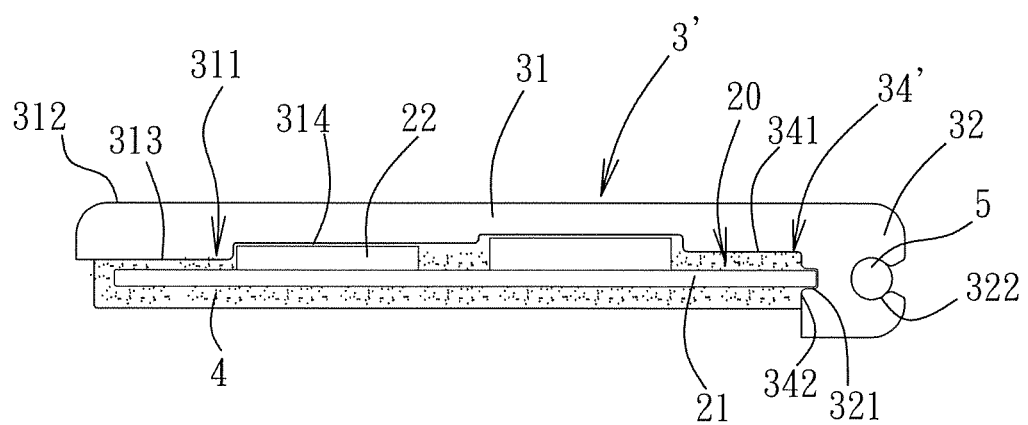
FIG. 20 is a schematic top view of the third preferred embodiment.

FIGS. 19 and 20 illustrate a circuit board device 220 according to the third preferred embodiment of the present invention. The whole structure and the manufacturing method of the circuit board device 220 are similar to that described in the first preferred embodiment. However, in this embodiment, the heat dissipation housing 3' of the circuit board device 220 has an L-shaped cross section, and includes a first panel 31, and an end plate 32 connected to one end of the first panel 31. The first panel 31 and the end plate 32 cooperatively define a receiving space 34'. The circuit board 20 divides the receiving space 34' into two opposite first and second receiving portions 341, 342. The first receiving portion 341 is located between the circuit board 20 and the first panel 31. The second receiving portion 342 is located on one side of the circuit board 20 that is opposite to the first panel 31.

Figure 21:
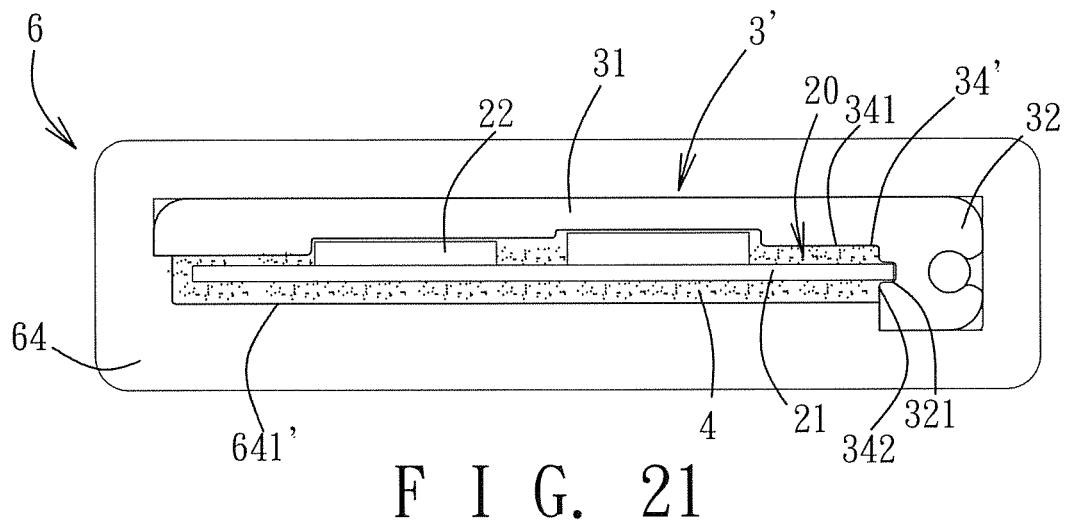
FIG. 21 is a schematic top view, illustrating the circuit board device disposed in the auxiliary mold.
Figure 22:
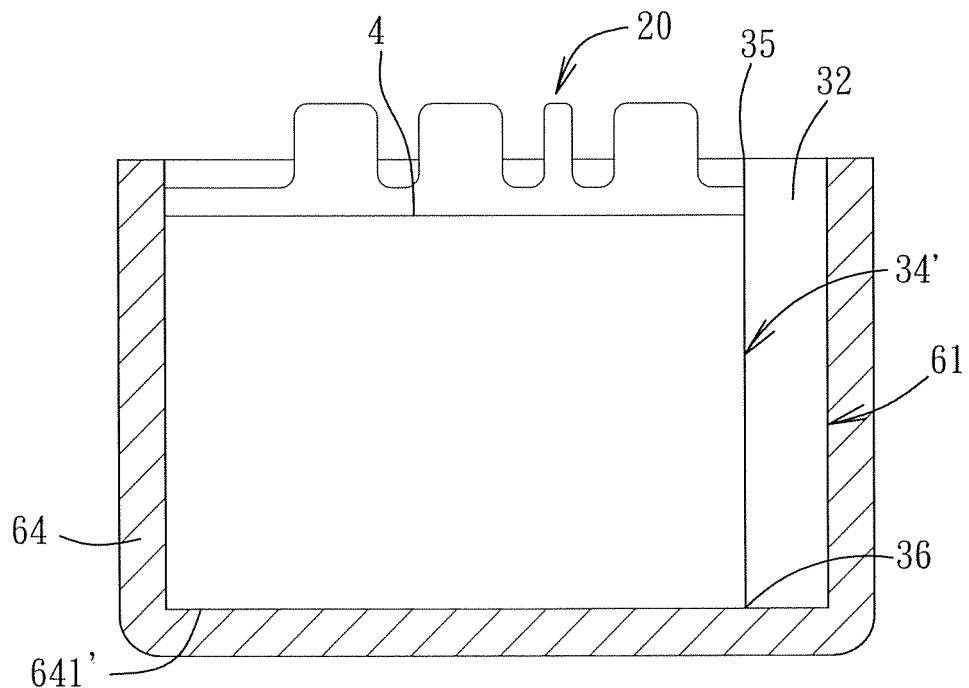
FIG. 22 is an enlarged sectional side view of the circuit board device and the auxiliary mold in the third preferred embodiment.

As shown in FIGS. 20, 21 and 22, after the forming face 641' of the mold cavity 64 of the auxiliary mold 6 combines with the dissipation housing 3', the second opening 36 in the heat dissipation housing 3' is closed, a side of the heat dissipation housing 3' that is opposite to the first panel 31, and another side of the dissipation housing 3' that is opposite to the end plate 32. As such, the receiving space 34' communicates with the outside only through the first opening 35. After the liquid state heat conductive adhesive 4 is filled into the receiving space 34', and through the cooperation of the forming face 641' and the heat dissipation housing 3', the heat conductive adhesive 4 can adhere the circuit board 20 and the heat dissipation housing 3' after it is cured.

Figure 23:
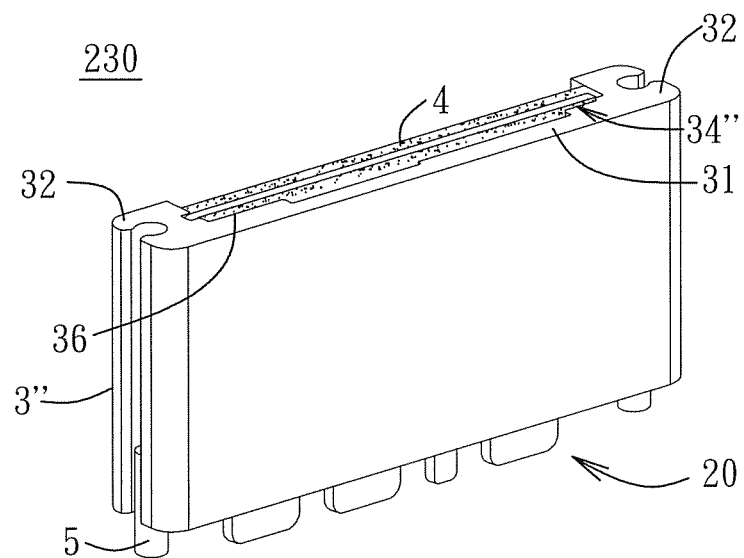
FIG. 23 is a perspective view of a circuit board device according to the fourth preferred embodiment of the present invention.
Figure 24:
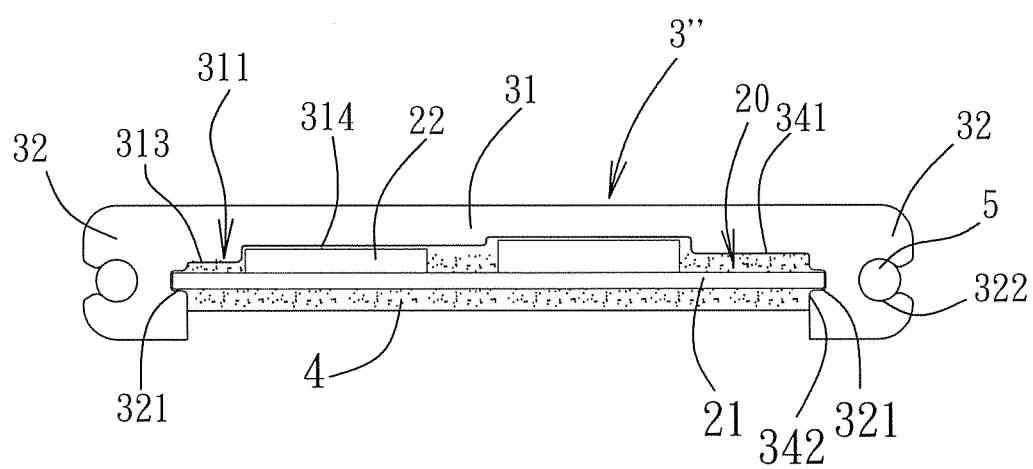
FIG. 24 is a schematic top view of the fourth preferred embodiment.

FIGS. 23 and 24 illustrate a circuit board device 230 according to the fourth preferred embodiment of the present invention. The whole structure and the manufacturing method of the circuit board device 230 are similar to that described in the first and third preferred embodiments. However, in this embodiment, the heat dissipation housing 3" has a U-shaped cross section, and includes a first panel 31, and two end plates 32 connected respectively to two opposite ends of the first panel 31. The first panel 31 and the two end plates 32 cooperatively define a receiving space 34".

As shown in FIGS. 24, 25 and 26, after the forming face 641" of the mold cavity 64 of the auxiliary mold 6 combines with the dissipation housing 3", the second opening 36 in the heat dissipation housing 3" and a side of the heat dissipation housing 3" that is opposite to the first panel 31 are closed. As such, the receiving space 34" communicates with the outside only through the first opening 35. After the heat conductive adhesive 4 is filled into the receiving space 34" of the heat dissipation housing 3", through the cooperation of the forming face 641" and the heat dissipation housing 3", the heat conductive adhesive 4 can adhere the circuit board 20 and the heat dissipation housing 3" after it is cured.

Figure 27:
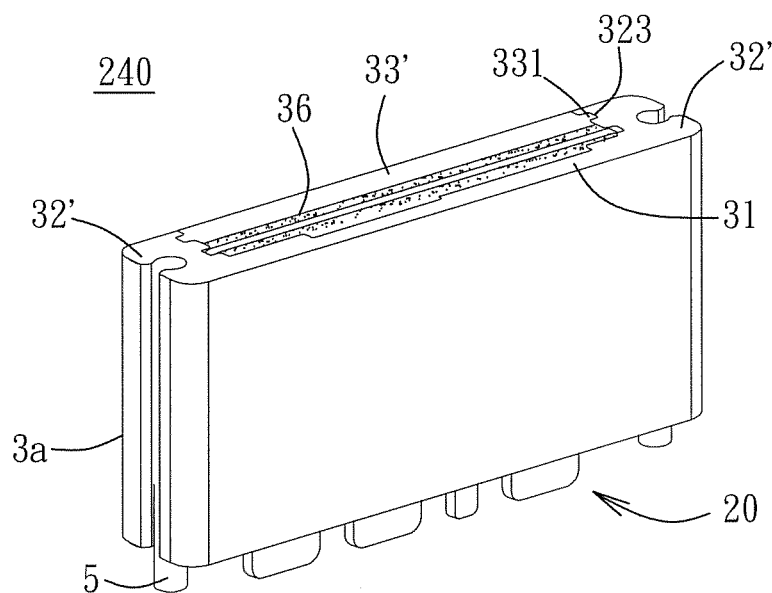
FIG. 27 is a perspective view of a circuit board device according to the fifth preferred embodiment of the present invention.
Figure 28:
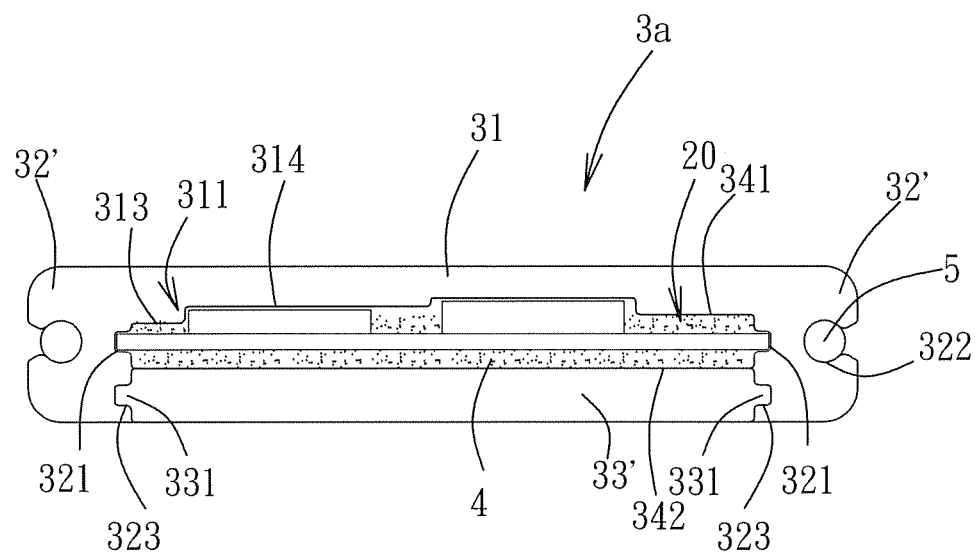
FIG. 28 is a schematic top view of the fifth preferred embodiment.

FIGS. 27 and 28 illustrate a circuit board device 240 according to the fifth preferred embodiment of the present invention. The whole structure and the manufacturing method of the circuit board device 240 are similar to that described in the first and fourth preferred embodiments. However, in this embodiment, the second panel 33' of the heat dissipation housing (3a) is connected removably to the two end plates 32', and includes two slide ribs 331 projecting outwardly and respectively from two opposite ends thereof. Each of the end plates 32' is formed with a slide groove 323 at a side opposite to the channel groove 322 and spaced apart from the retaining groove 321. Each of the slide ribs 331 and each of the slide grooves 323 extend vertically. The slide ribs 331 are connected slidably and respectively to the slide grooves 323 of the respective endplates 32', thereby connecting the second panel 33' to the two end plates 32'.

In summary, by using the heat conductive adhesive 4 to cover the circuit board 20 and adhere to the heat dissipation housing 3, 3', 3", (3a), heat generated during operation of the electronic components 22 and the circuit board 20 can be transmitted to the heat conductive adhesive 4 through multiple directions of conductive paths, and from the heat conductive adhesive to the heat dissipation housing 3, 3', 3", (3a), thereby effectively enhancing the uniformity and efficiency of heat dissipation of the circuit board devices 200, 210, 220, 230, 240 in each embodiment of the present invention. Further, in the manufacturing method of the circuit board devices 200, 210, 220, 230, 240, the complexity and number of assembly steps are simplified and the number of assembling components is reduced. As such, assembly time can be decreased, and the efficiency of production can be enhanced. Moreover, the circuit board devices 200, 210, 220, 230, 240 can be mass produced. Hence, the objects of the present invention can be realized.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A circuit board device comprising:
    a heat dissipation housing including a first panel, and at least one end plate connected to one end of said first panel and formed with a retaining groove, said first panel and said at least one end plate cooperatively defining a receiving space that communicates with said retaining groove, and a first opening that communicates with a bottom end of said receiving space;
    a circuit board configured for insertion into said receiving space through said first opening and having one end inserted into said retaining groove, said circuit board being disposed in spaced apart relationship with said first panel; and
    a heat conductive adhesive filling said receiving space through said first opening and embedding said circuit board such that said heat conducting adhesive contacts two opposite surfaces of said circuit board, and further contacts said first panel and said at least one end plate, wherein said heat conductive adhesive is adhered to said first panel and said at least one end plate and covers said circuit board, and wherein said first opening communicates said receiving space and said retaining groove with an external environment.

2. The circuit board device of claim 1, wherein said one end of said first panel includes two opposite ends, said at least one end plate of said heat dissipation housing including two end plates, each of said two end plates being connected to a respective one of said two opposite ends of said first panel, said heat conductive adhesive being adhered to each of said two end plates, said first panel and said two end plates cooperatively defining said receiving space and said first opening, each of said two end plates being formed with said retaining groove, said retaining groove of said heat dissipation housing including retaining grooves, said one end of said circuit board including two opposite ends inserted respectively into said retaining grooves of said two end plates.

3. The circuit board device of claim 2, wherein said heat dissipation housing further includes a second panel having two opposite ends connected respectively to each of said two end plates, said second panel being spaced apart from a side of said circuit board that is opposite to said first panel, said first and second panels and said two ends plates cooperatively defining said receiving space and said first opening, said heat conductive adhesive being further adhered to said second panel.

4. The circuit board device of claim 3, wherein said second panel is connected removably to said two end plates, and includes two slide ribs projecting outwardly and respectively from said two opposite ends thereof, each of said two end plates being formed with a slide groove spaced apart from said retaining groove, each of said slide ribs being connected slidably to said slide groove of a respective one of said two end plates.

5. The circuit board device of claim 1, wherein said circuit board includes a board body, and an electronic component disposed on one side of said board body, said first panel having an inner panel surface facing said board body, and an outer panel surface opposite to said inner panel surface, said inner panel surface including a main surface portion spaced apart from said one side of said board body, and a stepped surface portion extending outwardly from said main surface portion toward said outer panel surface and spaced apart from said electronic component, said board body having a plurality of terminals extending out of said first opening, said circuit board dividing said receiving space into a first receiving portion and a second receiving portion, said first receiving portion being located between said circuit board and said first panel, said second receiving portion being located opposite to said first receiving portion, an area obtained by deducting a cross-sectional area of said electronic component from a cross-sectional area of said first receiving portion being equal to a cross-sectional area of said second receiving portion.

6. A power supply comprising:
 a main circuit board; and
 a circuit board device including a heat dissipation housing, a circuit board disposed in said heat dissipation housing and connected electrically to said main circuit board, and a heat conductive adhesive adhered to said heat dissipation housing and covering said circuit board, wherein said heat dissipation housing includes a first panel, and at least one end plate connected to one end of said first panel and formed with a retaining groove, said first panel and said at least one end plate cooperatively defining a receiving space that communicates with said retaining groove, and a first opening that communicates with a bottom end of said receiving space, said circuit board being configured for insertion into said receiving space through said first opening and disposed in spaced apart relationship with said first panel, and a having one end inserted into said retaining groove, said heat conductive adhesive filling said receiving space through said first opening and embedding said circuit board such that said heat conducting adhesive contacts two opposite surfaces of said circuit board, and further contacts said first panel and said at least one end plate, wherein said heat conductive adhesive is adhered to said first panel and said at least one end plate.

7. The power supply of claim 6, wherein said at least one end plate is further formed with a channel groove at a side opposite to said retaining groove, said circuit board device further including a solder pin inserted into said channel groove and having a portion extending out of a bottom end of said channel groove and soldered to said main circuit board.

8. The power supply of claim 6, wherein said one end of said first panel includes two opposite ends, said at least one end plate of said heat dissipation housing including two end plates, each of said two end plates being connected to a respective one of said two opposite ends of said first panel, said heat conductive adhesive being adhered to each of said two end plates, said first panel and said two end plates cooperatively defining said receiving space and said first opening, each of said two end plates being formed with said retaining groove, said retaining groove of said heat dissipation housing including retaining grooves, said one end of said circuit board including two opposite ends inserted respectively into said retaining grooves of said two end plates.

9. The power supply of claim 8, wherein said heat dissipation housing further includes a second panel having two opposite ends connected respectively to said two end plates, said second panel being spaced apart from a side of said circuit board that is opposite to said first panel, said first and second panels and said two end plates cooperatively defining said receiving space and said first opening, said heat conductive adhesive being further adhered to said second panel.

10. The power supply of claim 9, wherein said second panel is connected removably to said two end plates, and includes two slide ribs projecting outwardly and respectively from said two opposite ends thereof, each of said two end plates being formed with a slide groove spaced apart from said retaining groove, each of said slide ribs being connected slidably to said slide groove of a respective one of said two end plates.

11. The power supply of claim 9, wherein said first and second panels and said two end plates further cooperatively define a second opening communicating with a top end of said receiving space, said circuit board device further including a heat sink unit, said heat sink unit including a heat sink, and an insert portion disposed on a bottom end of said heat sink, said insert portion extending into said receiving space through said second opening to contact said circuit board, said heat conductive adhesive being further adhered to said insert portion.

12. The power supply of claim 6, wherein said circuit board includes a board body, and an electronic component disposed on one side of said board body, said first panel having an inner panel surface facing said board body, and an outer panel surface opposite to said inner panel surface, said inner panel surface including a main surface portion spaced apart from said one side of said board body, and a stepped surface portion extending outwardly from said main surface portion toward said outer panel surface and spaced apart from said electronic component, said board body having a plurality of terminals connected electrically to said main circuit board, said circuit board dividing said receiving space into a first receiving portion and a second receiving portion, said first receiving portion being located between said circuit board and said first panel, said second receiving portion being located opposite to said first receiving portion, an area obtained by deducting a cross-sectional area of said electronic component from a cross-sectional area of said first receiving portion being equal to a cross-sectional area of said second receiving portion.

* * * * *